(12) United States Patent
Weng et al.

(10) Patent No.: US 7,898,070 B2
(45) Date of Patent: Mar. 1, 2011

(54) IMAGE SENSOR PACKAGE AND FABRICATION METHOD THEREOF

(75) Inventors: Jui-Ping Weng, Miaoli (TW);
Jang-Cheng Hsieh, Hsinchu (TW);
Tzu-Han Lin, Hsinchu (TW); Pai-Chun Peter Zung, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 0 days.

(21) Appl. No.: 12/543,804

(22) Filed: Aug. 19, 2009

(65) Prior Publication Data
US 2009/0309178 A1    Dec. 17, 2009

Related U.S. Application Data

(62) Division of application No. 11/822,011, filed on Jun. 29, 2007, now Pat. No. 7,595,220.

(51) Int. Cl.
*H01L 23/02* (2006.01)
*H01L 21/00* (2006.01)
(52) U.S. Cl. ............ 257/680; 438/51; 438/64; 438/106; 438/116; 257/E21.499
(58) Field of Classification Search .................. 438/116, 438/51, 64, 106; 257/680, E21.499
See application file for complete search history.

(56) References Cited

U.S. PATENT DOCUMENTS

| 7,300,857 | B2 * | 11/2007 | Akram et al. ................ 438/459 |
| 7,531,443 | B2 | 5/2009 | Pratt |
| 2004/0137723 | A1 | 7/2004 | Noma et al. |
| 2005/0194670 | A1 * | 9/2005 | Kameyama et al. .......... 257/678 |
| 2006/0261340 | A1 * | 11/2006 | Farnworth et al. ............. 257/59 |

FOREIGN PATENT DOCUMENTS

| CN | 1409869 | 4/2003 |
| CN | 1577875 | 2/2005 |
| CN | 2726120 | 9/2005 |

* cited by examiner

*Primary Examiner* — Andy Huynh
*Assistant Examiner* — Aaron A Dehne
(74) *Attorney, Agent, or Firm* — Muncy, Geissler, Olds & Lowe, PLLC

(57) ABSTRACT

The invention provides an image sensor package and method for fabricating the same. The image sensor package comprises a first substrate comprising a sensor device thereon and a hole therein. A bonding pad comprising a first opening is formed on an upper surface of the first substrate. A second substrate comprising a spacer element with a second opening therein is disposed on the first substrate. A conductive plug is formed in the hole and passes through the first and second openings to the second substrate to electrically contact with the bonding pad. A conductive layer is formed on a lower surface of the first substrate and electrically connects to the conductive plug. A solder ball is formed on the conductive layer and electrically connects to the bonding pad by the conductive plug. The image sensor package further comprises a second substrate bonding to the first substrate. The image sensor package is relatively less thick, thus, the dimensions thereof are relatively reduced.

10 Claims, 7 Drawing Sheets

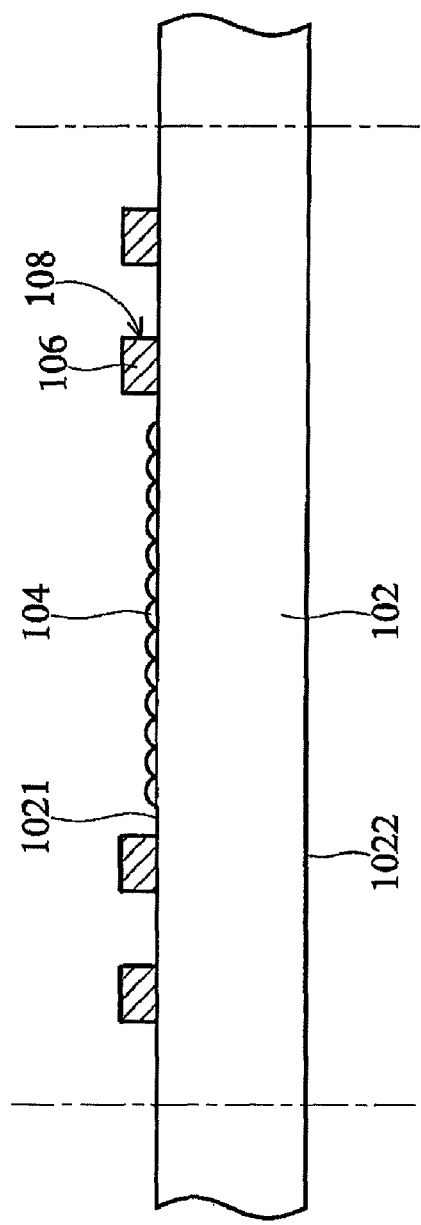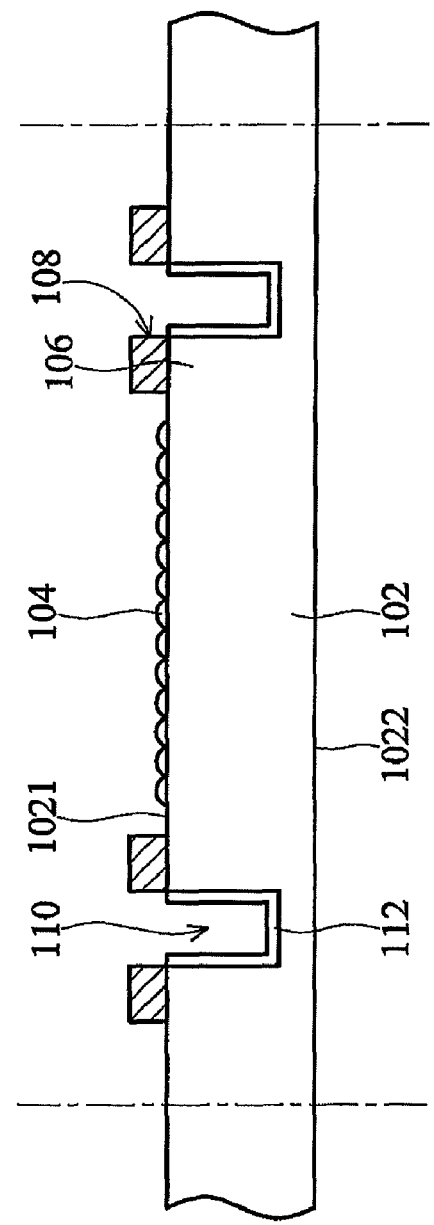

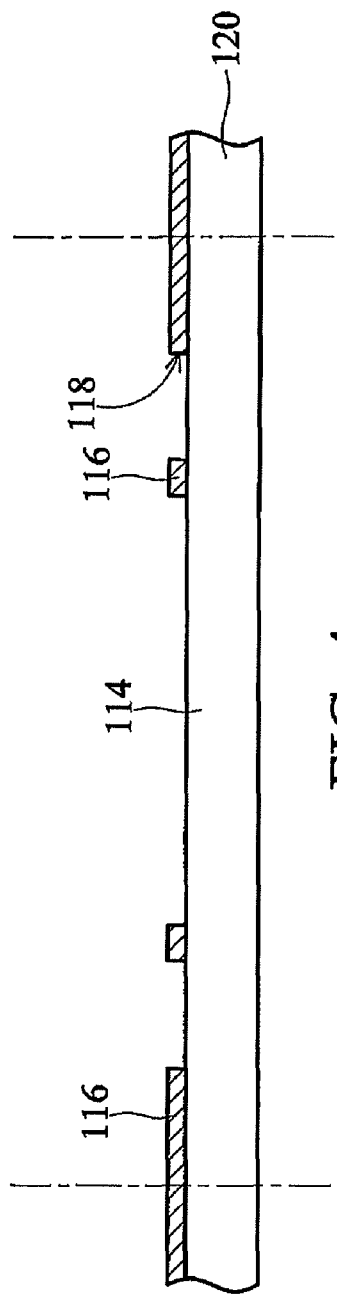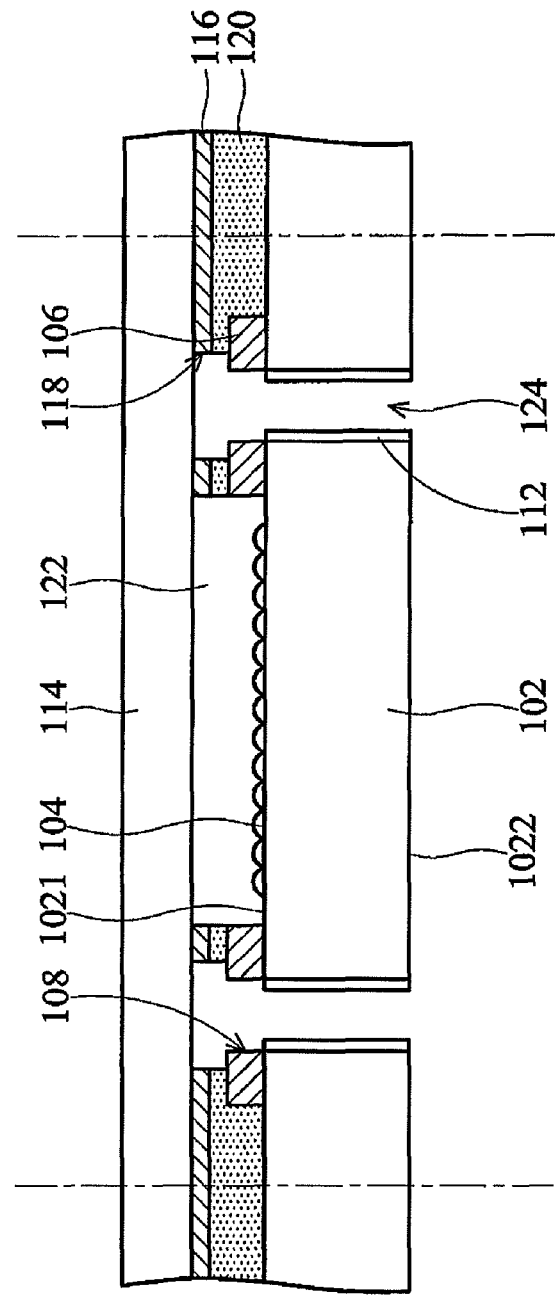

US 7,898,070 B2

IMAGE SENSOR PACKAGE AND FABRICATION METHOD THEREOF

CROSS REFERENCE TO RELATED APPLICATIONS

This application is a Divisional of application Ser. No. 11/822,011, filed on Jun. 29, 2007, now U.S. Pat. No. 7,595,220 and for which priority is claimed under 35 U.S.C. §120; the entire contents of which are hereby incorporated by reference.

BACKGROUND OF THE INVENTION

1. Field of the Invention

The invention relates to image sensor packages, and more particularly to an image sensor package with reduced dimensions and a method for fabricating the same.

2. Description of the Related Art

An essential step in the manufacturing of all integrated circuit devices is known as packaging. Integrated circuit devices are widely used in digital applications subsequent to packaging. For example, digital cameras, digital video recorders, mobile phones, and computers.

FIG. 1 is a cross section of a conventional image sensor package. A chip 2 is provided with a sensor device 4 formed thereon. A bonding pad 6 is formed on the chip 2 and electrically connects to the sensor device 4. In FIG. 1, a covering plate 8 is bonded to the chip 2 followed by attaching to a carrying substrate 10. A conductive layer 12 is formed on a backside and extends to a sidewall of the carrying substrate 10 to electrically connect to the bonding pad 6. A solder ball 14 is formed on the conductive layer 12 and electrically connects to the bonding pad 6. In the conventional image sensor package, a chip, a covering plate, and a carrying substrate are all required. Thus, the dimensions of a conventional image sensor package are large. Because the conductive layer is formed on the exterior disposition of the image sensor package, the conductive layer is easily damaged during fabrication.

Thus, an image sensor package and fabrication method thereof improving upon the described problems is needed.

BRIEF SUMMARY OF INVENTION

Accordingly, the invention provides an image sensor package. An exemplary embodiment of the image sensor package comprises a first substrate comprising a sensor device thereon and a hole therein; a bonding pad comprising a first opening formed on an upper surface of the first substrate; a second substrate disposed on the first substrate; a spacer element comprising a second opening formed on the second substrate; a conductive plug formed in the hole and through the first and second openings to the second substrate to electrically contact with the bonding pad; a conductive layer formed on a lower surface of the first substrate and electrically connected to the conductive plug; and a solder ball formed on the conductive layer and electrically connected to the bonding pad. The image sensor package further comprises a second substrate bonded to the first substrate. The thickness of the image sensor package is reduced because a chip substrate, on which the sensor device is formed, is ground and another substrate serving as carrying plate is not necessary. Thus, the dimensions of the image sensor package are reduced. Moreover, the conductive layer is formed on the lower surface of the first substrate and electrically connects to the bonding pad by the conductive plug rather than extending on the exterior sidewall of the first substrate to the bonding pad. Thus, damage of the conductive layer during fabrication is avoided to increase fabrication yield.

The invention also provides a method for fabricating an image sensor package. The method comprises providing a first substrate comprising a sensor device thereon and a hole therein; forming a bonding pad comprising a first opening on an upper surface of the first substrate; disposing a second substrate on the first substrate; forming a spacer element comprising a second opening on the second substrate; forming a conductive plug in the hole and through the first and second openings to second substrate to electrically contact with the bonding pad; forming a conductive layer on a lower surface of the first substrate and electrically connected to the conductive plug; and forming a solder ball on the conductive layer and electrically connected to the bonding pad.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 2-8 are cross sections of a method for fabricating an image sensor package according to an embodiment of the invention.

DETAILED DESCRIPTION OF THE INVENTION

Figure 1:
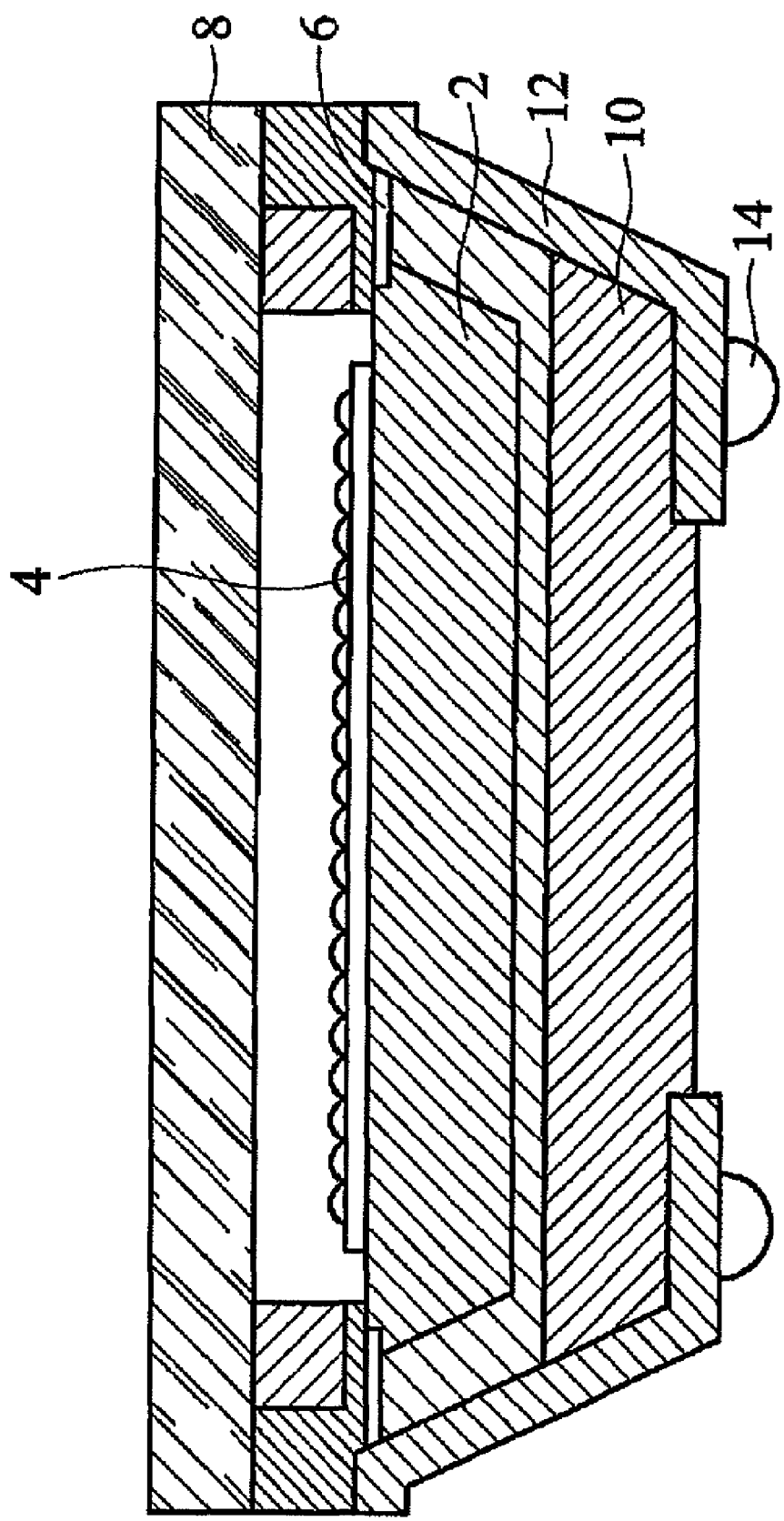
FIG. 1 is cross section of a conventional image sensor package.

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-8 are cross sections of a method for fabricating an image sensor package according to an embodiment of the invention. Although the invention will be described with respect to preferred embodiments of a method for fabricating an image sensor package. The invention may also be applied to fabricating package for others semiconductor devices.

In FIG. 2, a first substrate 102 having an upper surface 1021 and a lower surface 1022 is provided. Preferably, the first substrate 102 is made of bulk silicon, silicon on insulator, or other suitable semiconductor material. The upper surface 1021 may be referred to as a foreside, and the lower surface 1022 may also be referred to as a backside. A sensor device 104 such as complementary metal oxide semiconductor (CMOS) or charge coupled device (CCD) is formed on the upper surface 1021 of the first substrate 102. In one embodiment, the sensor device 104 may be formed by CMOS processes. Moreover, the first substrate 102 may also be referred to as an image sensor chip substrate.

As shown in FIG. 2, a bonding pad 106 comprising an opening 108 is subsequently formed on the upper surface 1021 of the first substrate 102 and electrically connects to the sensor device 104. In one embodiment, a conductive material layer such as copper is formed on the upper surface 1021 of the first substrate 102 by, for example, sputtering, evaporating, or plasma enhanced chemical vapor deposition (PE-VCD). The conductive material layer is then patterned by photolithography and etching to form the bonding pad 106 and the opening 108 therein. The opening 108 may be a circular shape and surround and expose a portion of the upper surface 1021 of the first substrate 102.

In FIG. 3, a cavity 110 is formed in the first substrate 102 by dry-etching. In some embodiments, the portion of upper surface 1021 of the first substrate 102 exposed by the opening 108 is removed by dry-etching such as plasma etching. An insulating layer 112 is subsequently formed in the cavity 110. In one embodiment, the insulating material layer such as silicon oxide, silicon nitride or other suitable insulating material is conformingly deposited on the upper surface 1021 of the first substrate 102 and disposed on the sidewalls and the bottom of the cavity 110 by chemical vapor deposition (CVD), low pressure chemical vapor deposition (LPCVD), or plasma enhanced chemical vapor deposition (PECVD). Then, a patterned photoresist layer (not shown) is formed in the cavity 110, which servers as a masking layer, followed by removal of a portion of the insulating material layer to form the insulating layer 112, as shown in FIG. 3.

In FIG. 4, a second substrate 114, also referred to as a covering plate, is provided with a spacer element 116 comprising an opening 118 formed thereon. Preferably, the second substrate 114 may be a transparent material such as glass, quartz, opal, or plastic. In one embodiment, a protecting layer (not shown) is optionally formed on a surface of the second substrate 114 opposite the spacer element 116 to prevent from abrasion.

In one embodiment, a layer such as polyimide, photoresist material or epoxy is conformingly formed on the second substrate 114. The layer is subsequently patterned by photolithography and etching to form the spacer element 116 having the opening 118 therein, as shown in FIG. 4.

In FIG. 5, the second substrate 114 is then disposed on the first substrate 102 to form a distance therebetween. In one embodiment, an adhesive layer 120 is coated on the spacer element 116 followed by bonding the second substrate 114 to the first substrate 102. Note that the cavity 110 (shown in FIG. 3) is sealed by bonding to form an airtight space (not shown) between the first and second substrates 102 and 114. Moreover, the opening 118 is correspondingly disposed on the opening 108 and a distance between sidewalls of the opening 118 is more than that of the opening 108. That is, the opening 118 is larger than the opening 108. Thus, a potion of an upper surface of the bonding pad 106 is exposed to contact a conductive plug subsequently formed.

Figure 6:
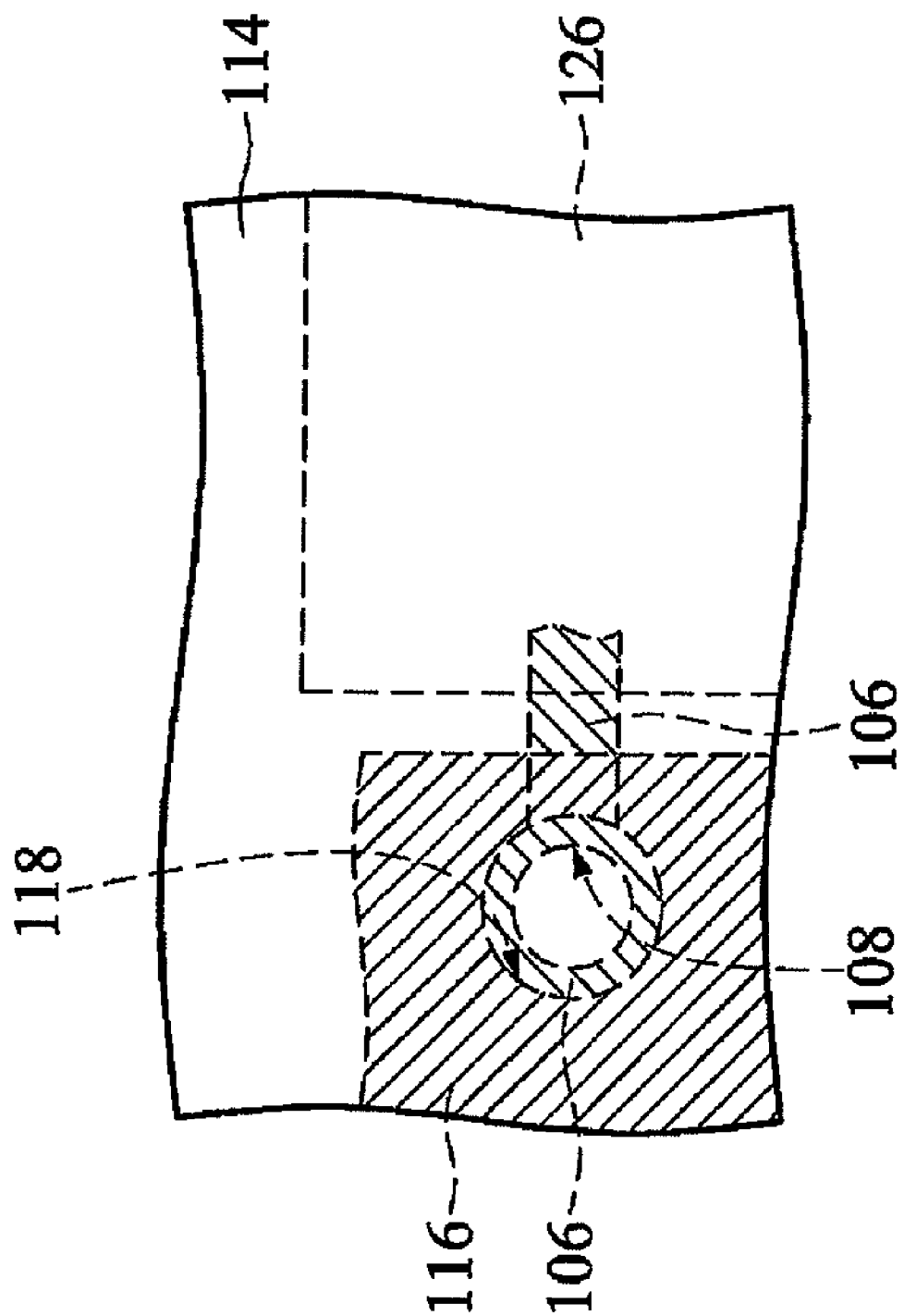

FIG. 6 is a plan view of an image sensor package shown in FIG. 5, in which the plan view is illustrated in a local view to describe an embodiment of the invention. In FIG. 6, a portion of the second substrate 114 is outlined by dotted and nondoted lines, and a sensor device region 126 depicts an area where the sensor device 104 (not labeled) is formed. The bonding pad 106 extends to the sensor device region 126 and electrically connects to the sensor device 104. The spacer element 116 is formed outside the sensor device region 126 and covers a portion of the bonding pad 106. Note that because the opening 118 is larger than the opening 108, a portion of the bonding pad 106 is thus exposed so that the overlapping openings 118 and 108 become concentric circles, which likes that of a donut, as shown in FIG. 6.

It's appreciated that the shape of the overlapping openings 118 and 108 may be any shape such as triangle or polygon. In FIG. 6, although one overlapping opening 118 and 108 is shown, the overlapping opening may be numerous and surround the sensor device region 126.

As shown in FIG. 5, the first substrate 102 is thinned to form a hole 124. In one embodiment, a portion of the first substrate 102 from the lower surface 1021 to the airtight space and further to the insulating layer 112 on the bottom of the cavity 110 (not labeled) is removed to form the hole 124 by grinding or polishing. The grinding or polishing may be performed by chemical mechanical polishing (CMP) process.

Figure 7:
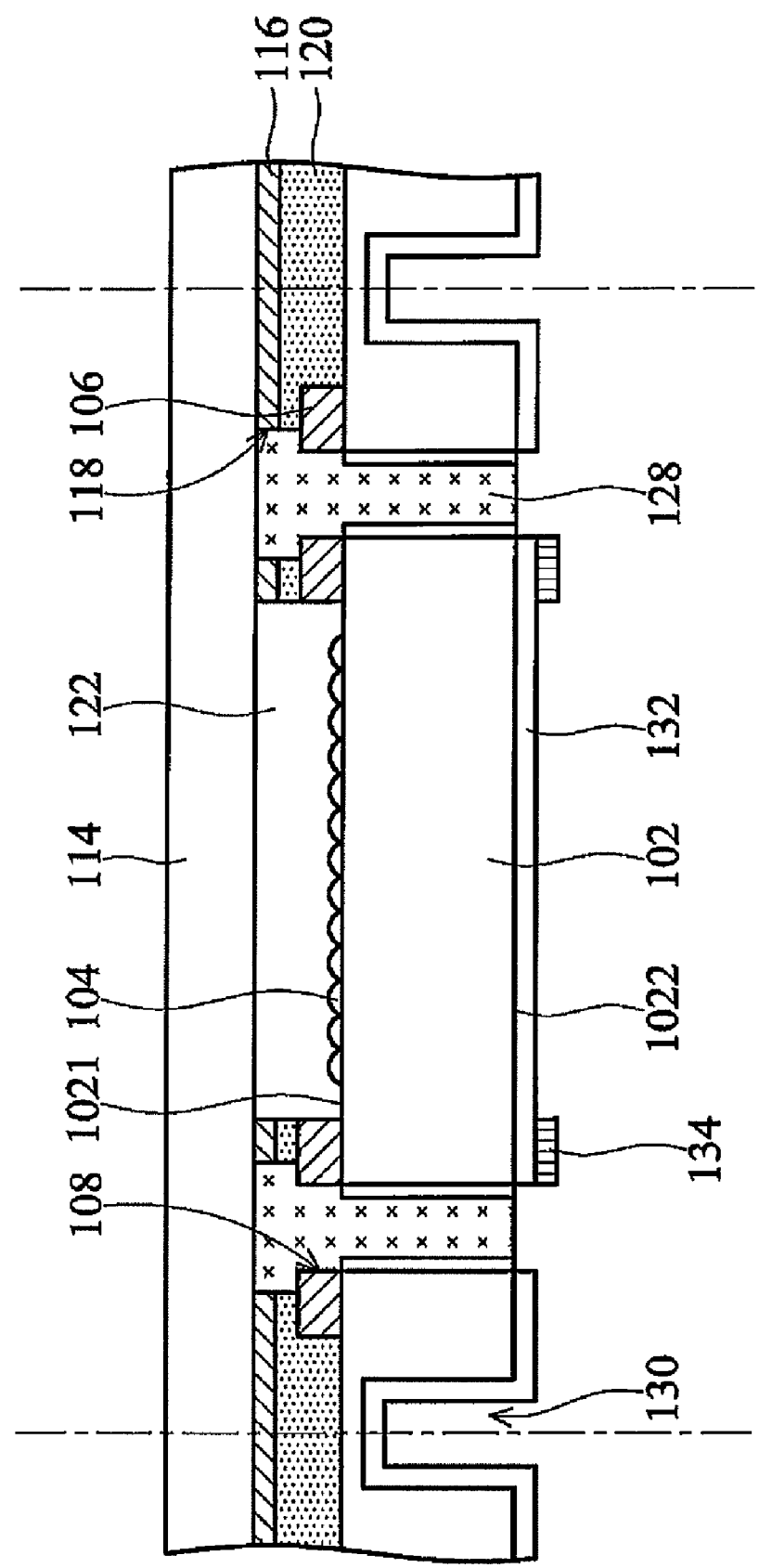

In FIG. 7, a conductive plug 128 is subsequently formed in the hole 124, passes through the bonding pad 106 and spacer element 116 and electrically contacts with the bonding pad 106. In one embodiment, a conductive material such as copper, gold, aluminum, tungsten or alloy thereof is formed in the hole 124 and passes through the opening 108 formed in the bonding pad 106 and the opening 118 formed in the spacer element 116 and further extends to the second substrate 114 by electroplating, or electroless-plating.

Note that the spacer element 116 and bonding pad 106 may surround the conductive plug 128 due to the openings 108 and 118, respectively. Moreover, since the opening 118 is larger than the opening 108 the conductive plug 128 has a top surface larger than its bottom surface. Because the conductive plug 128 contacts the upper surface and sidewall of the bonding pad 106, the conductive area of the subsequently formed image sensor package is increased.

As shown in FIG. 7, a trench 130 is formed in the first substrate 102 followed by depositing of an insulating layer 132 on the lower surface 1022 of the first substrate 102. In some embodiments, a portion of the first substrate 102 is dry-etched along a predetermined dicing line to form the trench 130. Then, the insulating layer 132 such as silicon oxide, silicon nitride, silicon oxynitride is conformingly formed on the lower surface 1022 of the first substrate 102 and the trench 130. A portion of the insulating layer 132 is subsequently removed to expose the conductive plug 128. In FIG. 7, a cushioning layer 134 such as polyimide (PI), or photoresist material is formed on the insulating layer 132. The cushioning layer 134 is formed at the location where a solder ball is to be subsequently formed.

Figure 8:
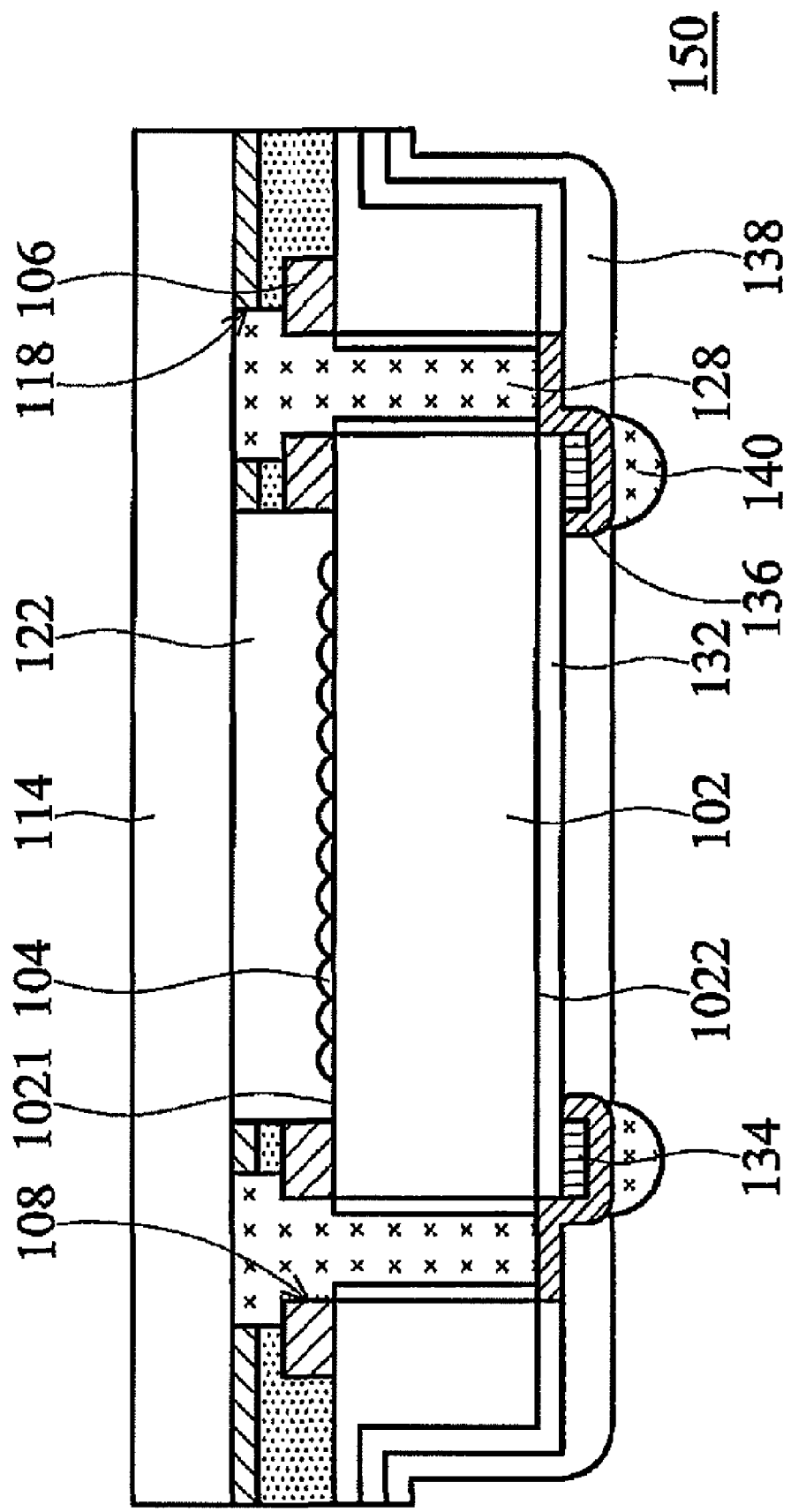

In FIG. 8, a conductive layer 136, also referred to as redistribution layer, is subsequently formed on the cushioning layer 134 and electrically connects to the conductive plug 128. In one embodiment, a conductive material layer such as aluminum, copper, nickel, or any suitable conductive material is formed on the lower surface 1022 of the first substrate 102 by sputtering, evaporating, electroplating or PECVD. Then, the conductive material layer is patterned by photolithographic and etching to form the conductive layer 136. Because the conductive material layer is patterned, the signal path from the sensor device 104 may be re-layout.

A solder mask 138 is coated on the conductive layer 136 and exposes a portion of the conductive layer 136 to define the location where the solder ball is formed. Then, the solder ball 140 is formed on the conductive layer 136 to electrically connect thereto. In one embodiment, a solder material is formed on the exposed conductive layer 136 followed by a reflow step to form the solder ball 140. After described steps, an individual die is cut along a predetermined cutting line thereof. Thus, fabrication of an image sensor package 150 according to an embodiment of the invention, as shown in FIG. 8, is complete.

Note that because the first substrate, on which the sensor device is formed, is further thinned. Thus, the image sensor package according to an embodiment of the invention has an overall thickness thinner than that of a conventional image sensor package using three substrates including an image sensor chip substrate, covering plate and carrying substrate. Moreover, since the conductive layer is formed on the lower surface of the first substrate and electrically connects the bonding pad by the conductive plug formed inside the hole of the first substrate, the conductive layer is not formed on a sidewall of the first substrate. Thus, damage to the conductive layer during fabrication, for example cutting, is eliminated and fabrication yield is further improved.

Furthermore, the conductive plug of the image sensor package according to an embodiment of the invention has a top surface larger than a bottom surface thereof. Thus, the mechanical strength of the image sensor package is enhanced and the firmness is further improved.

Figure 9:
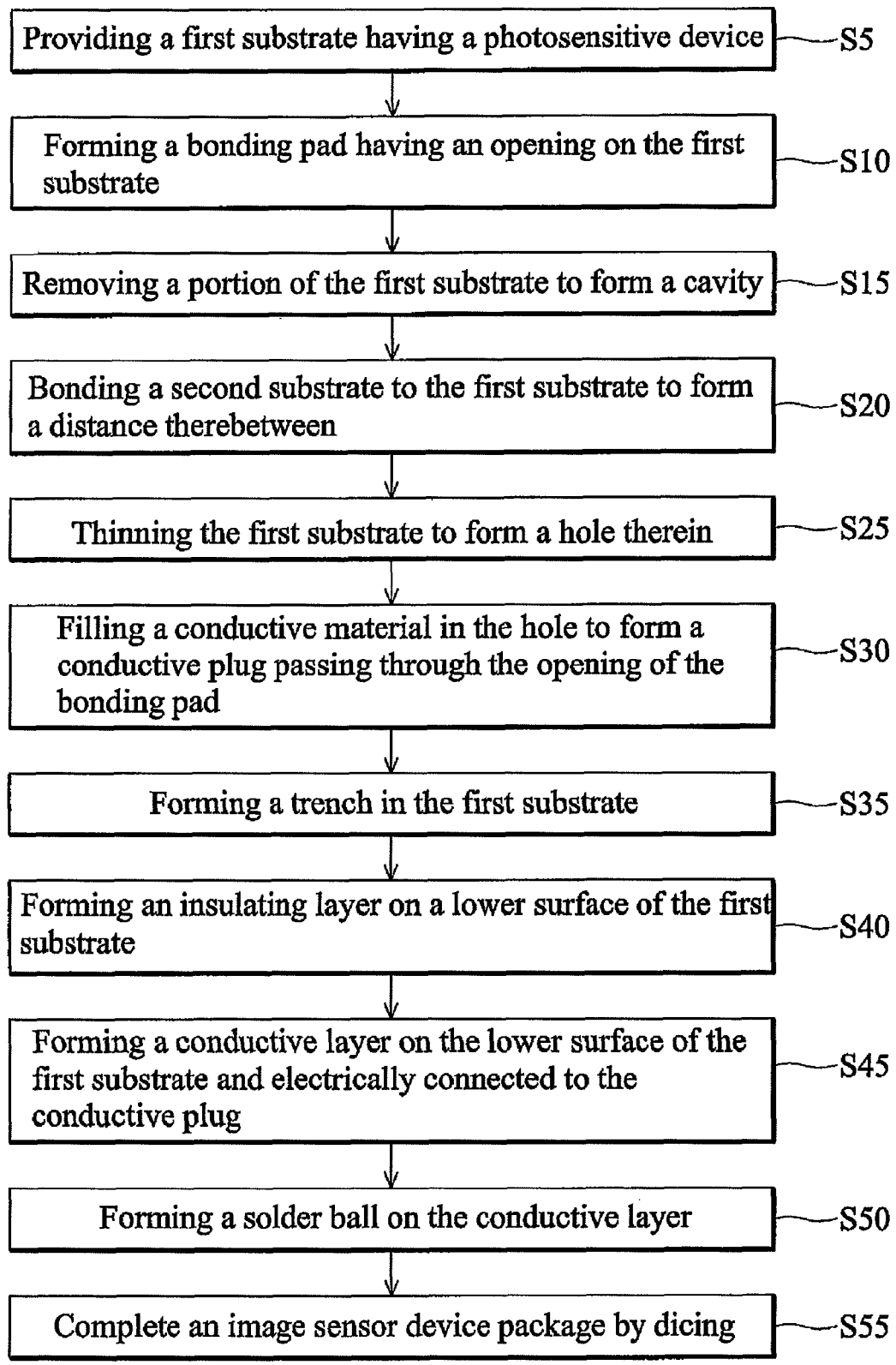
FIG. 9 is a flowchart of a method for fabricating an image sensor package according to an embodiment of the invention.

FIG. 9 is a flowchart of a method for fabricating an image sensor package according to an embodiment of the invention. In FIG. 9, the method comprises: providing a first substrate having a sensor device, as shown in S5; forming a bonding pad having an opening on the first substrate, as shown in S10; removing a portion of the first substrate to form a cavity, as shown in S15; bonding a second substrate to the first substrate to form a distance therebetween, as shown in S20; thinning the first substrate to form a hole therein, as shown in S25; filling a conductive material in the hole to form a conductive plug passing through the opening of the bonding pad, as shown in S30; forming a trench in the first substrate, as shown in S35; forming an insulating layer on a lower surface of the first substrate, as shown in S40; forming a conductive layer on the lower surface of the first substrate and electrically connected to the conductive plug, as shown in S45; forming a solder ball on the conductive layer, as shown in S50; and complete an image sensor package by dicing, as shown in S55.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package for image sensor device, comprising:
   a first substrate comprising a sensor device thereon and a hole therein;
   a bonding pad comprising a first opening formed on an upper surface of the first substrate;
   a second substrate disposed on the first substrate;
   a spacer element comprising a second opening formed on the second substrate;
   a conductive plug formed in the hole and through the first opening of the bonding pad and the second opening of the spacer element to the second substrate to directly contact the upper surface and a sidewall of the bonding pad;
   a conductive layer formed on a lower surface of the first substrate and electrically connected to the conductive plug; and
   a solder ball formed on the conductive layer and electrically connected to the bonding pad by the metal plug.

2. The package as claimed in claim 1, wherein the second opening is larger than the first opening.

3. The package as claimed 1, further comprising an adhesive layer formed between the first substrate and second substrate and surrounding the conductive plug.

4. The package as claimed in claim 1, further comprising an insulating layer formed in the hole and surrounding the conductive plug.

5. The package as claimed in claim 1, wherein the conductive plug has a top surface larger than a lower surface thereof.

6. The package as claimed in claim 1, wherein the bonding pad surrounds the conductive plug.

7. The package as claimed in claim 1, wherein the spacer element surrounds the conductive plug.

8. The package as claimed in claim 1, wherein the conductive plug comprises copper, gold, aluminum, tungsten or alloy thereof.

9. The package as claimed in claim 1, further comprising a cushioning layer formed on the lower surface of the first substrate.

10. The package as claimed in claim 1, further comprising a solder mask formed on the conductive layer.

* * * * *